(12) United States Patent
Yang

(10) Patent No.: US 12,174,499 B2
(45) Date of Patent: Dec. 24, 2024

(54) DISPLAY PANEL AND DISPLAY DEVICE

(71) Applicant: Hubei Yangtze Industrial Innovation Center of Advanced Display Co., LTD., Wuhan (CN)

(72) Inventor: Weiwei Yang, Wuhan (CN)

(73) Assignee: Hubei Yangtze Industrial Innovation Center of Advanced Display Co., LTD., Wuhan (CN)

(*) Notice: Subject to any disclaimer, the term of this patent is extended or adjusted under 35 U.S.C. 154(b) by 0 days.

(21) Appl. No.: 18/204,733

(22) Filed: Jun. 1, 2023

(65) Prior Publication Data

US 2024/0319550 A1 Sep. 26, 2024

(30) Foreign Application Priority Data

Mar. 21, 2023 (CN) .......................... 202310280368.7

(51) Int. Cl.
| | | |
|---|---|---|
| *G02F 1/136* | (2006.01) | |
| *G02F 1/1362* | (2006.01) | |
| *G02F 1/1368* | (2006.01) | |
| *H10K 59/121* | (2023.01) | |
| *H10K 59/131* | (2023.01) | |

(52) U.S. Cl.
CPC .... *G02F 1/13613* (2021.01); *G02F 1/136286* (2013.01); *G02F 1/1368* (2013.01); *H10K 59/1213* (2023.02); *H10K 59/131* (2023.02)

(58) Field of Classification Search
None
See application file for complete search history.

(56) References Cited

U.S. PATENT DOCUMENTS

2019/0088731 A1* 3/2019 Lee ................. H01L 29/78696
2023/0152656 A1* 5/2023 Wang ................... G02F 1/1681
359/265

* cited by examiner

*Primary Examiner* — Dung T Nguyen
(74) *Attorney, Agent, or Firm* — Anova Law Group, PLLC

(57) ABSTRACT

Display panel and display device are provided. The display panel includes a substrate and an array layer arranged on a side of the substrate. The array layer includes a first metal layer, an active layer, and a second metal layer. Along a first direction, the first metal layer and the second metal layer are on two sides of the active layer, and the first direction is perpendicular to the substrate. The array layer includes at least one first transistor including a first sub-transistor and a second sub-transistor connected in series, and the first sub-transistor includes a first active layer in the active layer, the second sub-transistor includes a second active layer in the active layer, the first active layer is connected to the second active layer. Along the first direction, the first metal layer overlaps both the first active layer and the second active layer.

20 Claims, 11 Drawing Sheets

10

A-A

B-B

DISPLAY PANEL AND DISPLAY DEVICE

CROSS-REFERENCE TO RELATED APPLICATION

This application claims priority of Chinese Patent Application No. 202310280368.7, filed on Mar. 21, 2023, the entire contents of which are hereby incorporated by reference.

FIELD OF THE DISCLOSURE

The present disclosure generally relates to the field of display technology and, more particularly, relates to a display panel and a display device.

BACKGROUND

From an era of cathode ray tube (CRT) to an era of liquid crystal display (LCD), and now to an era of organic light-emitting diode (OLED) display and an era of and light-emitting diode (LED) display, the display industry has experienced decades of development and is changing with each passing day. The display industry has been closely related to our lives, from traditional mobile phones, tablets, TVs, computers, to current smart wearable devices, virtual reality devices, vehicle displays, and other electronic devices, which are inseparable from the display technology.

In a display panel, a driving circuit is usually arranged to control a display of the display panel. At present, a response speed of the display panel is closely related to response speeds of transistors in the driving circuit. How to effectively improve the response speeds of transistors has become one of the technical problems to be solved urgently.

BRIEF SUMMARY OF THE DISCLOSURE

One aspect of the present disclosure provides a display panel. The display panel includes a substrate and an array layer arranged on a side of the substrate. The array layer includes a first metal layer, an active layer, and a second metal layer. Along a first direction, the first metal layer and the second metal layer are on two sides of the active layer, and the first direction is perpendicular to the substrate. The array layer includes at least one first transistor including a first sub-transistor and a second sub-transistor connected in series, and the first sub-transistor includes a first active layer in the active layer, the second sub-transistor includes a second active layer in the active layer, the first active layer is connected to the second active layer. Along the first direction, the first metal layer overlaps both the first active layer and the second active layer, and the second metal layer overlaps the second active layer and does not overlap the first active layer.

Another aspect of the present disclosure provides a display device including a display panel. The display panel includes a substrate and an array layer arranged on a side of the substrate. The array layer includes a first metal layer, an active layer, and a second metal layer. Along a first direction, the first metal layer and the second metal layer are on two sides of the active layer, and the first direction is perpendicular to the substrate. The array layer includes at least one first transistor including a first sub-transistor and a second sub-transistor connected in series, and the first sub-transistor includes a first active layer in the active layer, the second sub-transistor includes a second active layer in the active layer, the first active layer is connected to the second active layer. Along the first direction, the first metal layer overlaps both the first active layer and the second active layer, and the second metal layer overlaps the second active layer and does not overlap the first active layer.

Other aspects of the present disclosure can be understood by a person skilled in the art in light of the description, the claims, and the drawings of the present disclosure.

BRIEF DESCRIPTION OF THE DRAWINGS

Accompanying drawings, which are incorporated into and constitute a part of the present specification, illustrate embodiments of the present disclosure and together with the description, serve to explain principles of the present disclosure.

DETAILED DESCRIPTION

Various exemplary embodiments of the present disclosure will be described in detail with reference to the accompanying drawings. It should be noted that, unless specifically stated otherwise, a relative arrangement of components and steps, numerical expressions and numerical values set forth in the embodiments do not limit the scope of the present disclosure.

The following description of at least one exemplary embodiment is merely illustrative and is not intended to limit the present disclosure and application or use thereof.

Techniques, methods, and apparatus known to a person skilled in the art may not be discussed in detail, but where appropriate, such techniques, methods, and apparatus should be considered as part of the present specification.

In all examples shown and discussed herein, any specific value should be construed as illustrative only and not as a limitation. Accordingly, other examples of exemplary embodiments may have different values.

It will be apparent to a person skilled in the art that various modifications and variations can be made in the present disclosure without departing from the spirit or scope of the present disclosure. Accordingly, the present disclosure is intended to cover the modifications and variations of the present disclosure that fall within the scope of corresponding claims (claimed technical solutions) and equivalents thereof. It should be noted that, implementations provided in the embodiments of the present disclosure may be combined with each other if there is no contradiction.

It should be noted that similar numerals and letters refer to similar items in the following accompanying drawings. Once an item is defined in one accompanying drawing, the item does not require further discussion in subsequent accompanying drawings.

Figure 1:
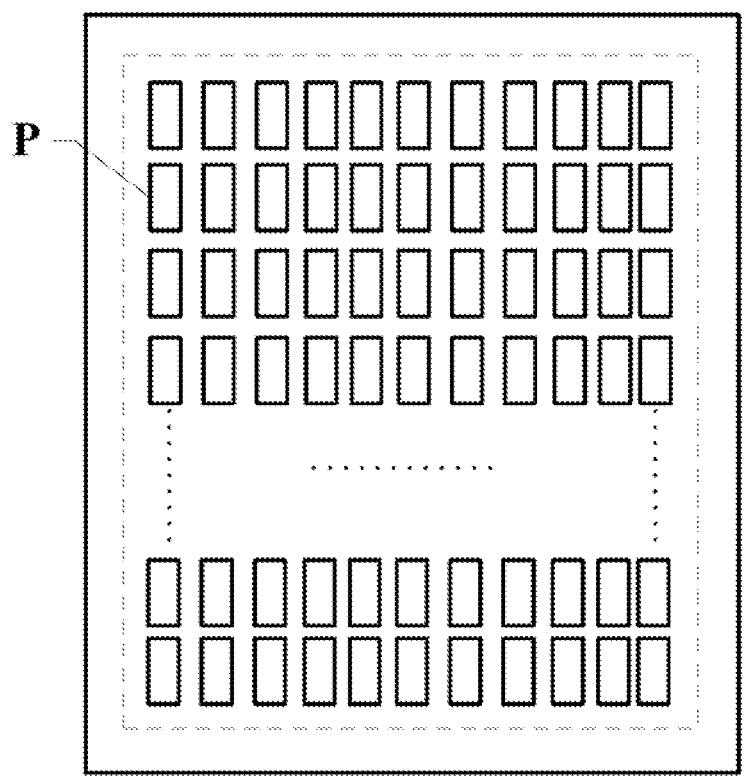
FIG. 1 illustrates a schematic diagram of a display panel consistent with various embodiments of the present disclosure.
Figure 2:
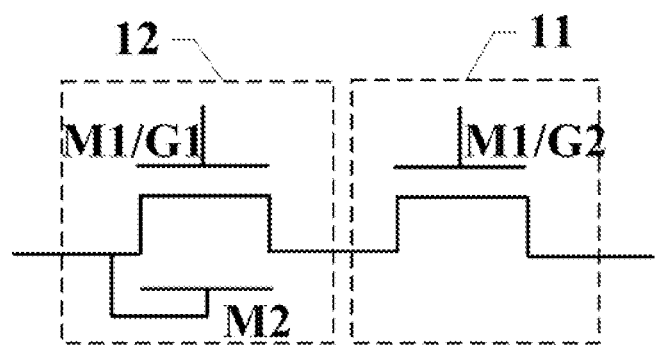
FIG. 2 illustrates a connection diagram of a first sub-transistor and a second sub-transistor in a first transistor.
Figure 3:
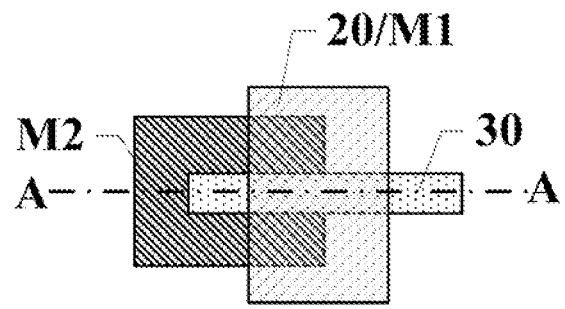
FIG. 3 illustrates a top view of a first transistor contained in a display panel.
Figure 4:
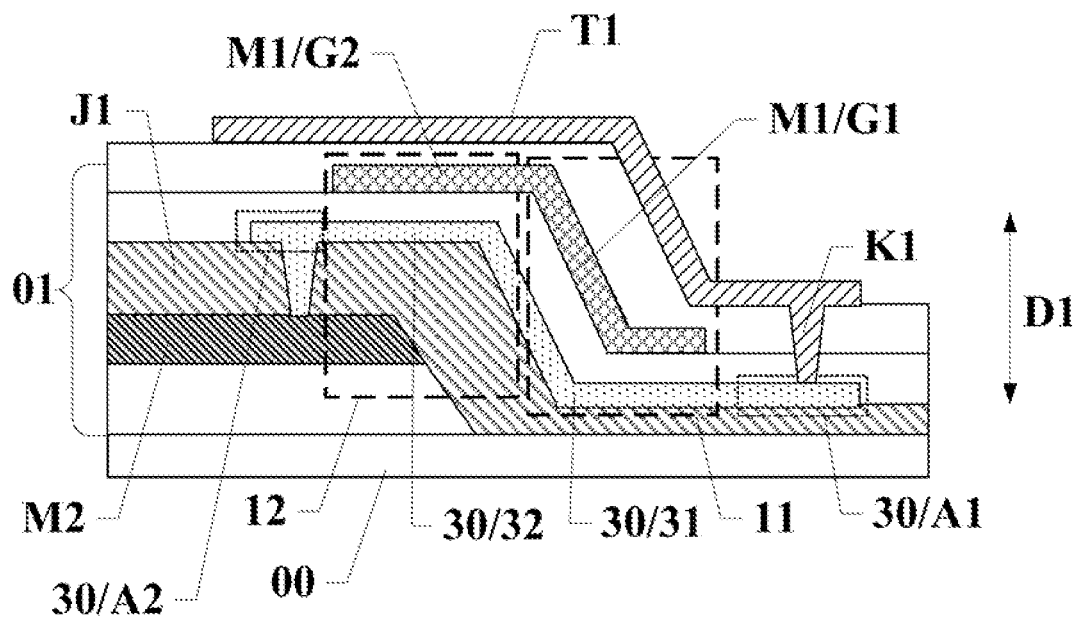
FIG. 4 illustrates an AA cross-sectional view of the first transistor in FIG. 3 of a display panel.

FIG. 1 illustrates a schematic diagram of a display panel consistent with various embodiments of the present disclosure. FIG. 2 illustrates a connection diagram of a first sub-transistor 10 and a second sub-transistor 11 in a first transistor 10. FIG. 3 illustrates a top view of the first transistor 10 contained in the display panel. FIG. 4 illustrates an AA cross-sectional view of the first transistor 10 in FIG. 3 of the display panel.

Referring to FIG. 1 to FIG. 4, one embodiment provides a display panel 100, including a substrate 00 and an array layer 01 arranged on a side of the substrate. The array layer 01 includes a first metal layer M1, an active layer 30 and a second metal layer M2. Along a first direction D1, the first metal layer M1 and the second metal layer M2 are on two sides of the active layer 30. The first direction D1 is perpendicular to the substrate 00.

The array layer 01 includes at least one first transistor 10, including a first sub-transistor 11 and a second sub-transistor 12 connected in series. The first sub-transistor 11 includes a first active layer 31 in the active layer 30. The second sub-transistor 12 includes a second active layer 32 in the active layer 30. The first active layer 31 is connected to the second active layer 32.

Along the first direction D1, the first metal layer M1 overlaps both the first active layer 31 and the second active layer 32. The second metal layer M2 overlaps the second active layer 32 and does not overlap the first active layer 31.

It should be noted that FIG. 1 is only illustrated by taking the display panel with a rectangular structure as an example and does not limit a shape of the display panel. In some other embodiments, the shape of the display panel may also take on another form, such as a rounded rectangle, circle, or another feasible shape. FIG. 1 only illustrates an arrangement of sub-pixels P in the display panel and does not limit an actual pixel arrangement of the sub-pixels P in the display panel. FIG. 3 only illustrates relevant film layers in the first transistor 10, such as the active layer 30, the first metal layer M1 and the second metal layer M2 of the first transistor 10 but does not illustrate other film layer structures of the display panel. One embodiment shown in FIG. 4 can be regarded as a film layer structure at a position of the first transistor 10 in the display panel, mainly to reflect a relative positional relationship between each film layer in the first transistor 10 and does not affect an actual number and size of film layers in the display panel.

Referring to FIG. 1 to FIG. 4, in one embodiment, the display panel includes at least one first transistor 10 including a first sub-transistor 11 and a second sub-transistor 12. The first metal layer M1 overlaps the first active layer 31 to form a first gate G1 of the first sub-transistor 11, and the first metal layer M1 overlaps the second active layer 32 to form a second gate G2 of the second sub-transistor 12. Therefore, the first transistor 10 is a transistor with a double gate structure since the first transistor 10 has two gates.

Figure 5:
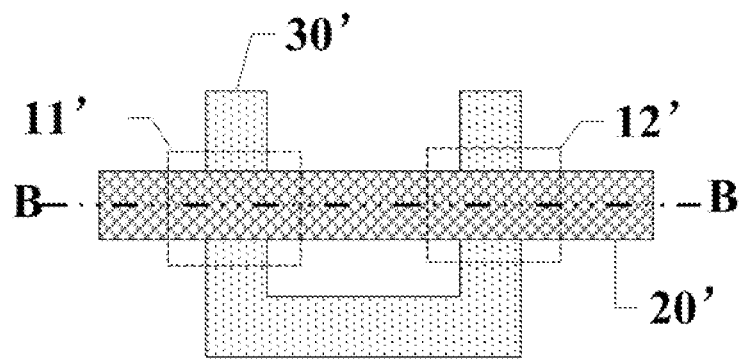
FIG. 5 illustrates a schematic diagram of a transistor.
Figure 6:
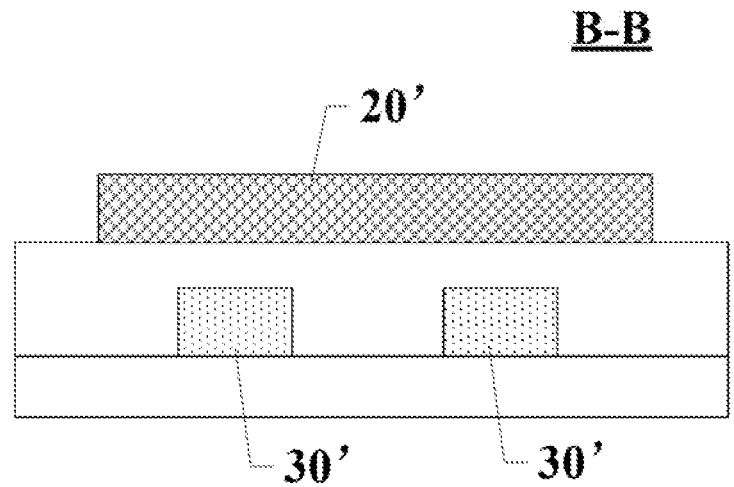
FIG. 6 illustrates a BB cross-sectional view of the first transistor in FIG. 5.

FIG. 5 illustrates a schematic diagram of a transistor. FIG. 6 illustrates a BB cross-sectional view of the first transistor in FIG. 5. Referring to FIG. 5 and FIG. 6, in a transistor with a double-gate structure, an active layer 30' is a U-shaped structure, and the transistor includes a first sub-transistor 11' and a second sub-transistor 12'. Vertical electric fields of the first sub-transistor 11' and the second sub-transistor 12' are only controlled by a metal layer 20' where a corresponding gate is located, so that on-state currents of the two sub-transistors cannot be further increased, and a response speed of the double-gate transistor is slow, resulting in a slow overall response speed of the display panel.

Referring to FIG. 2 to FIG. 4, in one embodiment, the second metal layer M2 is introduced in the display panel. Along the first direction D1, the second metal layer M2 overlaps the second active layer 32 and does not overlap the first active layer 31, so that a vertical electric field of the second sub-transistor 12 is not only controlled by a gate, but also controlled by the second metal layer M2. Therefore, a channel is formed on a surface of the second active layer 32 facing the first metal layer M1, and another channel is formed on a surface of the second active layer 32 facing the second metal layer M2. When two channels are formed in the second sub-transistor 12, an on-state current of the second sub-transistor 12 can be effectively increased, thereby helping to improve a response speed of the second sub-transistor 12, and further helping to improve an overall response speed of the first transistor 10. When the overall response speed of the first transistor 10 is increased, the overall response speed of the display panel is also effectively improved. In addition, the vertical electric field of the first sub-transistor 11 is only controlled by the gates, so the first sub-transistor 11 can control an overall threshold voltage of the first transistor 10 to ensure a stability of the first transistor 10.

Figure 7:
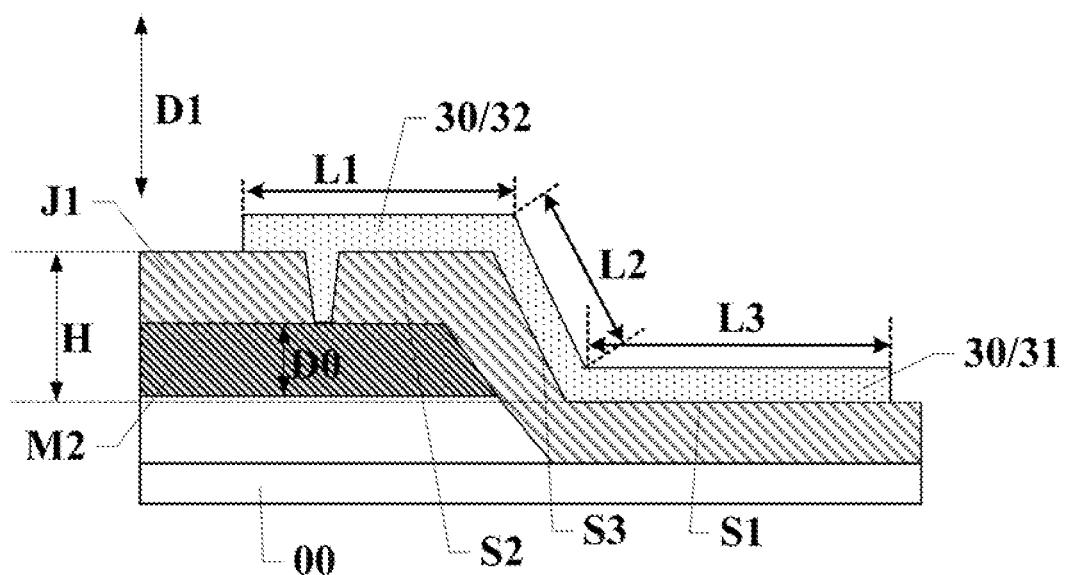
FIG. 7 illustrates a relative position relationship diagram of a first insulating layer, an active layer and a second metal layer.

FIG. 7 illustrates a relative position relationship diagram of a first insulating layer J1, an active layer 30 and a second metal layer M2. Referring to FIG. 4 and FIG. 7, in one optional embodiment, along the first direction D1, the second metal layer M2 is between the active layer 30 and the substrate 00. The display panel further includes the first insulating layer J1 arranged between the second metal layer M2 and the active layer 30. The first insulating layer J1 includes a first surface S1 on a side away from the substrate 00, a second surface S2, and an inclined surface S3 connecting the first surface S1 and the second surface S2. Along the first direction D1, a distance between the first surface S1 and the substrate 00 is smaller than a distance between the second surface S2 and the substrate 00. At least part of the first active layer 31 is on the first surface S1, at least part of the second active layer 32 is on the second surface S2, and the first active layer 31 and the second active layer 32 are connected on the inclined surface S3.

Specifically, referring to FIG. 4 and FIG. 7, in the embodiment, the first insulating layer J1 between the second metal layer M2 and the active layer 30 is arranged as an alien structure. Specifically, the inclined surface S3 is configured to connect the first surface S1 and the second surface S2 in the first insulating layer J1. Taking the substrate 00 as a reference, the first surface S1, the second surface S2 and the inclined surface S3 in the first insulating layer J1 are all surfaces of the first insulating layer J1 away from the substrate 00. The first surface S1 is a surface of the first insulating layer J1 that is closer to the substrate 00, and the second surface S2 is a surface of the first insulating layer J1 that is farther from the substrate 00. When the active layer 30 is arranged, the first active layer 31 is arranged on the first surface S1 and the inclined surface S3, the second active layer 32 is arranged on the second surface S2 and the inclined surface S3, and the first active layer 31 and the second active layer 32 are connected on the inclined surface S3. The two active layers 32 are connected at the inclined surface S3. Assuming that a distance between an end of the first active layer 31 away from the second active layer 32 and an end of the second active layer 32 away from the first active layer 31 is fixed, when the first active layer 31 and the second active layer 32 are arranged on a same horizontal plane, for example, when surfaces of the active layers facing away from the substrate 00 are on a same plane, a total length of the first active layer 31 and the second active layer 32 is a fixed length. When the inclined surface S3 is introduced into the first insulating layer J1, the total length of the first active layer 31 and the second active layer 32 in the above limited space is extended by the inclined surface S3. When the total length of the active layer 30 becomes larger, a total length of channels of the first sub-transistor 11 and the second sub-transistor 12 also becomes larger, to avoid a problem of too short channel lengths of the first sub-transistor 11 and the second sub-transistor 12. When a channel is too short, a short-channel transistor is easy to become a conductor, so that the transistor cannot function as a switch, and at a same time, may increase a forming difficulty of the transistor. Therefore, in the embodiment, the total length of the active layer 30 is extended by introducing the inclined surface S3 into the first insulating layer J1, which is conducive to ensuring a switching performance of the transistor and reducing a forming difficulty of the transistor.

In addition, when the first insulating layer J1 is arranged as an alien structure including the inclined surface S3 shown in FIG. 4 and FIG. 7, extending the active layer 30 and the channel length of the transistor in a limited space is equivalent to reducing a size of a space occupied by a single first transistor 10 in the display panel. Within a same size space, a greater number of first transistors can be arranged, which is conducive to improving a pixel density of the display panel.

Figure 8:
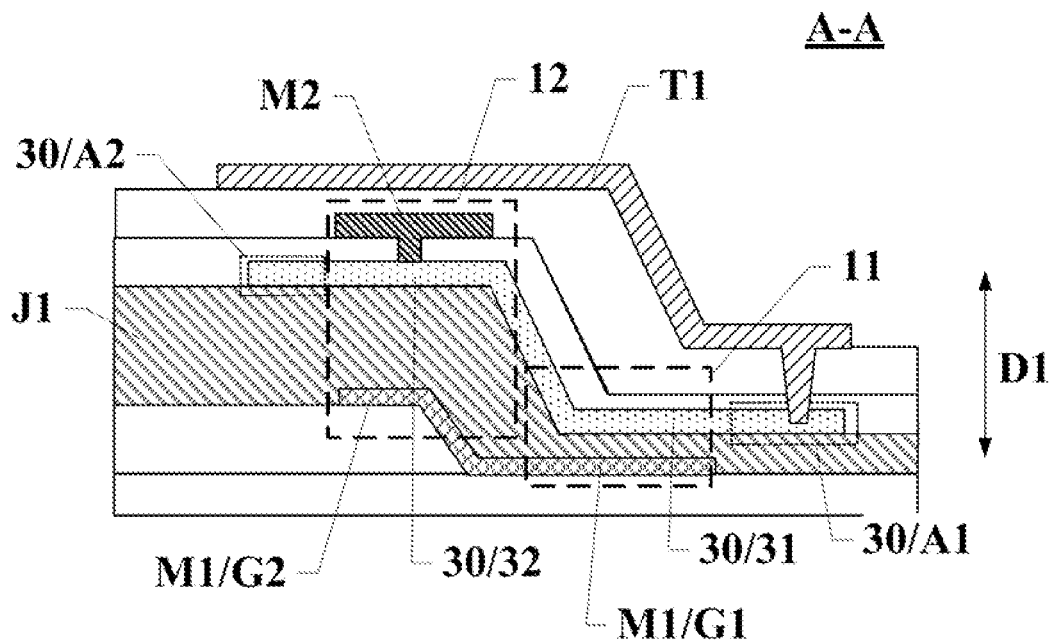
FIG. 8 illustrates another AA cross-sectional view of the first transistor in FIG. 3 of a display panel.

It should be noted that the embodiments shown in FIG. 4 and FIG. 7 are only described by taking the second metal layer M2 between the active layer 30 and the substrate 00 as an example. FIG. 8 illustrates another AA cross-sectional view of the first transistor 10 in FIG. 3 of the display panel. In some other embodiments, the first metal layer M1 may also be between the active layer 30 and the substrate 00 to form a transistor with a double-gate structure, which is conducive to improving the response speed of the first transistor and improving the overall response speed of the display panel.

Referring to FIG. 4, in one optional embodiment, the first active layer 31 includes a first doped region A1, and the second active layer 32 includes a second doped region A2. The first doped region A1 is at an end of the first active layer 31 away from the second active layer 32, and the second doped region A2 is at an end of the second active layer 32 far away from the first active layer 31. Along the first direction D1, the first metal layer M1 overlaps all the first surface S1, the inclined surface S3, and the second surface S2, while the first metal layer M1 does not overlap the first doped region A1 and the second doped region A2.

Specifically, in the display panel, the first active layer 31 is arranged with the first doped region A1, and the second active layer 32 is arranged with the second doped region A2. The first doped region A1 and the second doped region A2 can be regarded as regions doped with impurity ions in the active layer 30. Regions between the first doped region A1 and the second doped region A2 in the first active layer 31 and the second active layer 32 are non-doped channel regions. Along the first direction D1, the first metal layer M1 does not overlap the first doped region A1, nor does the first metal layer M1 overlap the second doped region A2. The region of the active layer 30 overlapping the first metal layer M1 along the first direction D1 can be regarded as a channel region between the first doped region A1 and the second doped region A2. One of the first doped region A1 and the second doped region A2 is used as a source of the first transistor 10, and the other of the first doped region A1 and the second doped region A2 is used as a drain of the first transistor 10, which are configured for connecting with other wires or devices in the display panel. A connection relationship between the first doped region A1 and the second doped region A2 is described in detail in subsequent embodiments.

Referring to FIG. 4, in one optional embodiment, the display panel further includes first electrodes T1 on a side of the first metal layer M1 away from the substrate. A first electrode T1 is electrically connected to the first doped region A1 through a first connection hole K1, and the second doped region A2 is electrically connected to the second metal layer M2.

In the embodiment, when the display panel includes the first electrodes T1, the first doped region A1 of the first transistor 10 is electrically connected to a first electrode T1, and the second doped region A2 is electrically connected to the second metal layer M2. Specifically, the first electrode T1 is arranged on a side of the first metal layer M1 away from the substrate and is isolated from the first metal layer M1 by an insulating layer. The first metal layer M1 is also isolated from the active layer 30 by an insulating layer. When electrically connecting the first electrode T1 and the first doped region A1, the first connection hole K1 can be formed on an insulating layer between the first electrode T1 and the first doped region A1, and the first electrode T1 are electrically connected to the first doped region A1 by using the first connection hole K1. Similarly, since the second doped region A2 is isolated from the second metal layer M2 by the first insulating layer J1, when the second doped region A2 is electrically connected to the second metal layer M2, a connection hole may be formed on the first insulating layer J1 between the second doped region A2 and the second metal layer M2. The second doped region A2 is electrically connected to the second metal layer M2 by using the connection hole. When the first transistor 10 is turned on, a signal in the second doped region A2 can be transmitted to the first doped region A1 through the first transistor 10 and subsequently to the first electrode T1 through the first doped region A1, thereby realizing a function of supplying the driving signal to the first electrode T1. In the first transistor 10, the second sub-transistor 12 overlaps the gate of the first transistor 10 to form a channel, and the second sub-transistor 12 overlaps with the second metal layer M2 to form another channel, which is conducive to increasing the on-state current of the second sub-transistor 12, so that the on-state current of the first transistor 10 increases. Under a high current, a voltage of the second doped region A2 can be transmitted to the first electrode T1 better and faster, which is conducive to improving the response speed of the display panel.

In addition, when the first doped region A1 is connected to the first electrode T1, and the second doped region A2 is connected to the second metal layer M2, the first doped region A1 is equivalent to the drain of the first transistor 10, and the second doped region A2 is equivalent to the source of the first transistor 10. There is no overlap between the source and the drain of the first transistor 10, and source voltage signals have less interference on the drain, which is conducive to reducing crosstalk between signals and improving qualities of images displayed on the display panel.

Figure 9:
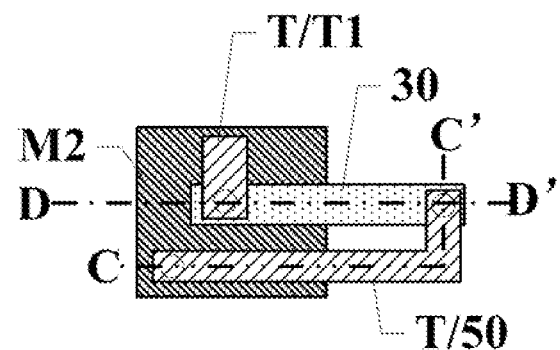
FIG. 9 illustrates a top view of a first transistor and a first electrode consistent with various embodiments of the present disclosure.
Figure 10:
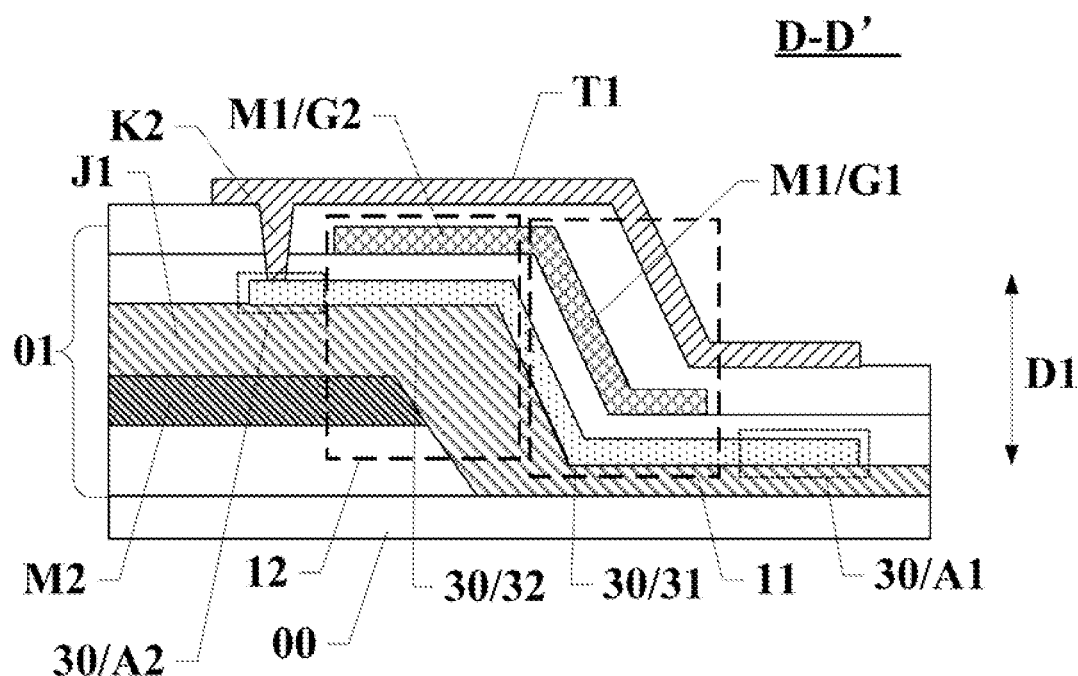
FIG. 10 illustrates a DD' cross-sectional view of the transistor in FIG. 9.
Figure 11:
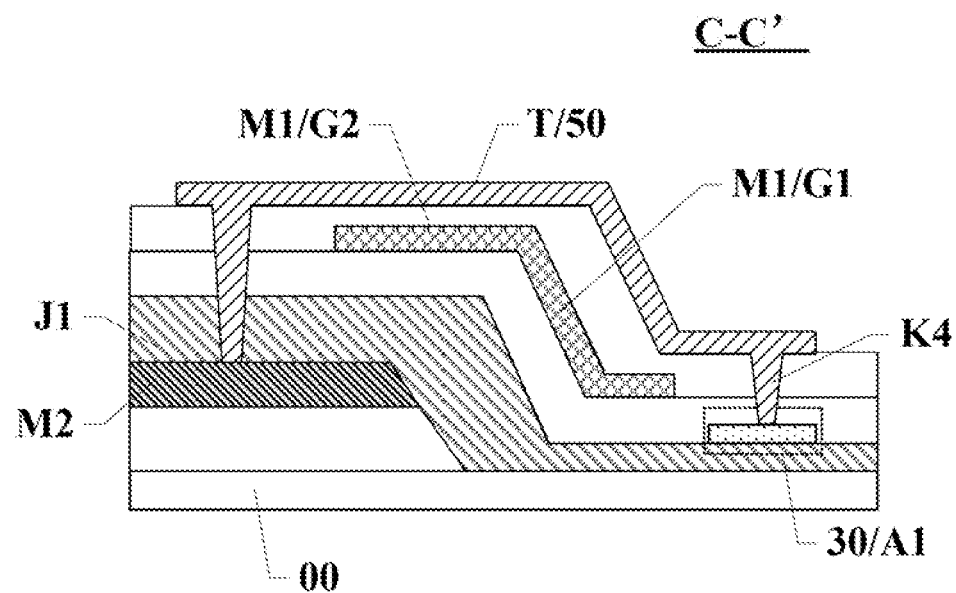
FIG. 11 illustrates a CC' cross-sectional view of the transistor in FIG. 9.

FIG. 9 illustrates a top view of the first transistor 10 and the first electrode T1 consistent with various embodiments of the present disclosure. FIG. 10 illustrates a DD' cross-sectional view of the transistor in FIG. 9. FIG. 11 illustrates a CC' cross-sectional view of the transistor in FIG. 9. A difference between one embodiment shown in FIG. 10 and the embodiment shown in FIG. 4 is a way in which the first transistor and the first electrode are connected. In the embodiment shown in FIG. 10, the second doped region A2 in the first transistor is electrically connected to the first electrode T1. In the embodiment shown in FIG. 4, the first doped region A1 in the first transistor is electrically connected to the first electrode T1.

Referring to FIG. 9 to FIG. 11, in one optional embodiment, the display panel further includes first electrodes T1 on a side of the first metal layer M1 away from the substrate 00. The first electrode T1 is electrically connected to the second doped region A2 through a second connection hole K2. The first doped region A1 is electrically connected to the second metal layer M2 through a first bridge portion 50.

In the embodiment, when the first electrode T1 is arranged in the display panel, the second doped region A2 is electrically connected to the first electrode T1, and the first doped region A1 is electrically connected to the second metal layer M2. The second doped region A2 connected to the first electrode T1 corresponds to the drain of the first transistor 10, and the first doped region A1 connected to the second metal layer M2 corresponds to the source of the first transistor 10. A driving signal is transmitted to the second doped region A2 through the first doped region A1, and subsequently to the first electrode T1, to realize a driving of the first electrode T1. In the embodiment, the first electrode T1 layer is isolated from the first metal layer M1 by an insulating layer, and the first metal layer M1 is also isolated from the active layer 30 by an insulating layer. The first electrode T1 and the second doped region A2 are electrically connected through the second connection hole K2 penetrating through the insulating layers. Since the first doped region A1 of the active layer 30 does not overlap the second metal layer M2 in the first direction D1, a first bridging portion 50 is arranged in the display panel. Referring to FIG. 11, the first bridge portion 50 is electrically connected to the first doped region A1 through a connection hole, and the first bridge portion 50 is electrically connected to the second metal layer M2 through another connection hole. Therefore, an electrical connection between the first doped region A1 and the second metal layer M2 can be realized through the first bridge portion 50. A signal of the second metal layer M2 connected to the first bridge portion 50 can be transmitted to the first doped region A1 through the first bridge portion 50, and subsequently to the second doped region A2 and the first electrode T1.

In the embodiment, in the second sub-transistor 12, the first metal layer M1 overlaps the first active layer 31 to form a channel, and the second metal layer M2 overlaps the first active layer 31 to form another channel. An arrangement of double channels effectively increases the on-state current of the second sub-transistor 12. A signal transmitted from the first sub-transistor 11 to the second sub-transistor 12 can be transmitted to the first electrode T1 more quickly and stably, which is also conducive to improving the response speed of the display panel.

Referring to FIG. 10 and FIG. 11, in one optional embodiment, both the first bridging portion 50 and the first electrode T1 are arranged on an electrode layer T. The first bridge portion 50 is electrically connected to the second metal layer M2 through a third connection hole K3 and is electrically connected to the first doped region A1 through a fourth connection hole K4. The second connection hole K2, the third connection hole K3 and the fourth connection hole K4 are formed in a same process.

Specifically, in the embodiment, the first bridge portion 50 connecting the first doped region A1 and the second metal layer M2 is arranged on a film layer where the first electrode T1 is located. Optionally, the first bridging portion 50 is made of a same material as the film layer where the first electrode T1 is located. Therefore, the first bridging portion 50 can be formed simultaneously with the first electrode T1 on the film layer where the first electrode is located, which is conducive to simplifying a forming process when arranging the first bridging portion 50 in the display panel. In addition, when the first bridging portion 50 and the first electrode T1 are arranged on a same layer, the first bridging portion 50 can be arranged without introducing a separate film layer in the display panel. An interface of the film layer where the first electrode T1 is located can be reused, simplifying an overall film layer structure of the panel.

Referring to FIG. 11, when the first bridge portion 50 and the first electrode T1 are arranged on a same layer, the first bridge portion 50 is electrically connected to the second metal layer M2 through the third connection hole K3, and the first bridge portion 50 is electrically connected to the first doped region A1 through the fourth connection hole K4. Referring to FIG. 4, the first electrode T1 is electrically connected to the second doped region A2 through the second connection hole K2. In an actual formation, forming the second connection hole K2, the third connection hole K3, and the fourth connection hole K4 by a photomask process simplifies the forming process of the display panel and reduces production costs by eliminating a need for different photomask processes for various types of connection holes.

Figure 12:
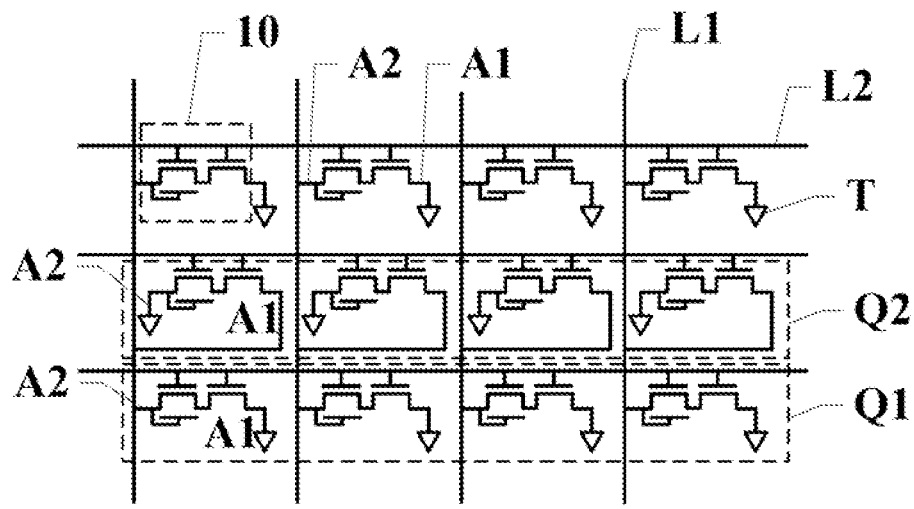
FIG. 12 illustrates a connection diagram of first transistors and first electrodes in a first region and a second region of a display panel.

FIG. 12 illustrates a connection diagram of the first transistors 10 and the first electrodes T1 in a first region and a second region of a display panel. Referring to FIG. 12, in combination with FIG. 4 and FIG. 10, in one optional embodiment, the display panel further includes first electrodes T1 on a side of the first metal layer M1 away from the substrate. The display panel includes a first region Q1 and a second region Q2. The first electrodes T1 in the first region Q1 are electrically connected to the first doped regions A1 through the first connection hole K1. The first electrodes T1 in the second region Q1 are electrically connected to the second doped regions A2 through the second connection hole K2.

It should be noted that the first region and the second region may respectively refer to display areas corresponding to a certain row or a certain column of sub-pixels in the display panel, may also refer to display areas corresponding to a plurality of rows and a plurality of columns of sub-pixels, such as a central display area and a peripheral display area, an upper half display area, a lower half display area, or the like. In the embodiment, only a certain row of sub-pixels corresponding to the first region Q1 and another row of sub-pixels corresponding to the second region Q2 are taken as an example for illustration, but actual positions of the first region and the second region in the display panel are not limited herein.

Optionally, the display panel includes data lines L1 and scan lines L2. Gates of the first transistors 10 are electrically connected to the scan lines, sources are electrically connected to the data lines, and drains are electrically connected to the first electrode. In one embodiment, first doped regions of part of the first transistors 10 are used as sources, and second doped regions of part of the first transistors 10 are used as drains. First doped regions of the other part of the first transistors 10 are used as drains, and second doped region of the other part of the second transistors 10 are used as sources.

In the embodiment, in the display panel, a connection relationship between the first electrodes T1 and the first transistors 10 in the first region Q1 is different from a connection relationship between the first electrodes T1 and the first transistors 10 in the second region Q2. In the first region Q1, the first electrodes T1 and the first transistors 10 are correspondingly arranged, and the first electrodes T1 are electrically connected to the first doped regions A1 of the first transistors 10, that is, the first doped regions A1 of the first transistors 10 in the first region Q1 corresponds to the drains of the first transistors 10. In the second region Q2, the first electrodes T1 and the first transistors 10 are correspondingly arranged, and the first electrodes T1 are electrically connected to the second doped regions A2 of the first transistor 10, that is, the second doped regions A2 of the first transistors 10 in the second region correspond to the drains of the first transistor 10. An area in the display panel that requires a higher image display quality can be used as the first region Q1, and the other display area can be used as the second region Q2. In the first region Q1, since the first doped regions A1 of the first transistors 10 serve as the drains to be electrically connected to the first electrodes T1, along the first direction D1, the first doped regions A1 do not overlap the second metal layer M2. That is, the second metal layer M2 does not form coupling capacitances with the first doped regions A1. Signals of the second metal layer M2 may not interfere with drain signals of the first transistors 10, which is conducive to improving an accuracy and a stability of the signals transmitted to the first electrodes T1, thereby improving an image quality.

Figure 13:
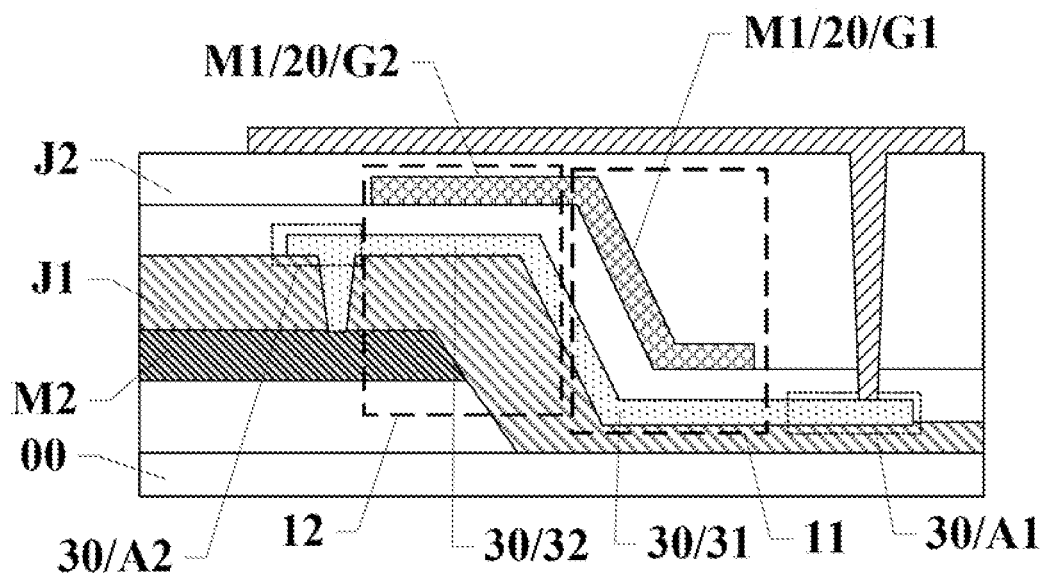
FIG. 13 illustrates another AA cross-sectional view of the first transistor in FIG. 3 of a display panel.

FIG. 13 illustrates another AA cross-sectional view of the first transistor 10 in FIG. 3 of a display panel.

Referring to FIG. 13, in one optional embodiment, the display panel further includes first electrodes T1 on a side of the first metal layer M1 away from the substrate 00. A second insulating layer J2 is arranged between the first electrode T1 and the first metal layer M1, and a surface of the second insulating layer J2 facing away from the substrate 00 is parallel to the substrate 00.

Specifically, when the first insulating layer J1 is arranged as a non-planar structure with an inclined surface S3, other insulating layers on a side of the first insulating layer J1 facing away from the substrate may also present a non-planar structure of the inclined surface S3 if no special treatment is performed. The first electrode T1 also exhibits a non-planar structure with an inclined surface S3. When the first electrode T1 has a non-planar structure, if the display panel is a liquid crystal display panel, the first electrode T1 is a pixel electrode, which may cause different electric fields applied to a liquid crystal by different areas of the pixel electrodes, affecting a normal deflection of the liquid crystal. If the display panel is an organic electroluminescent display panel, the first electrode T1 is an anode 71 of a light-emitting element 70, and light-emitting material structures need to be formed on the anode 71. If the anode 71 is uneven, a display effect is also affected. Therefore, in the embodiment, the second insulating layer J2 arranged between the first electrode T1 and the first metal layer M1 is improved, so that a surface of the second insulating layer J2 facing away from the substrate 00 has a flat structure. That is, the surface of the second insulating layer J2 facing away from the substrate 00 presents a planar structure parallel to the substrate 00. Therefore, when the first electrode T1 is formed on the surface of the second insulating layer J2 facing away from the substrate, the first electrode T1 also has a flat structure, and the first electrode T1 with a flat structure is more conducive to ensuring a display effect of the display panel.

Figure 14:
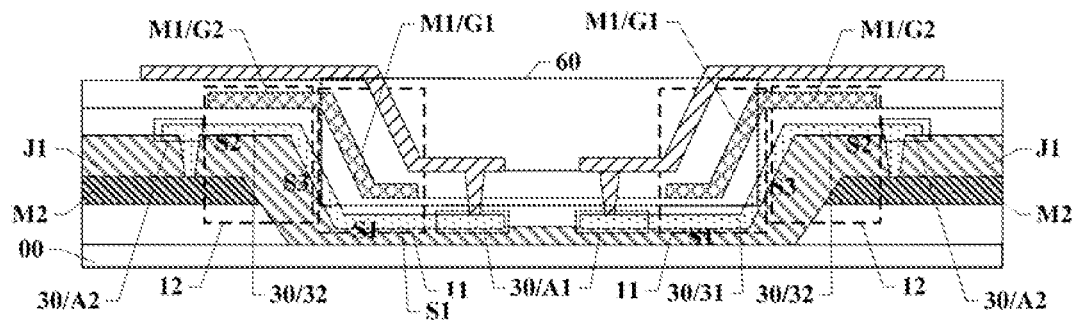
FIG. 14 illustrates a film layer diagram of two adjacent first transistors.

FIG. 14 illustrates a film layer diagram of two adjacent first transistors 10.

Referring to FIG. 14, in one optional embodiment, at least part of adjacent two first transistors 10 are arranged symmetrically. A symmetry axis is between the two adjacent first transistors 10 and is perpendicular to the substrate.

In the embodiment, adjacent two first transistors 10 are arranged symmetrically. Specifically, in the two adjacent first transistors 10, along an arrangement direction of two adjacent first transistors 10, two first doped regions A1 are between two second doped regions A2. The symmetry axis is between two adjacent first doped regions A1 and is perpendicular to the substrate, that is, the two first sub-transistors 11 are between the two second sub-transistors 12.

Referring to FIG. 14, in one optional embodiment, the display panel also includes a first insulating layer J1 arranged between the second metal layer M2 and the active layer 30. The first insulating layer J1 includes a first surface S1, a second surface S2, and an inclined surface S3 connecting the first surface S1 and the second surface S2. In the first insulating layer J1, the first surfaces S1 corresponding to the two symmetrically arranged first transistors 10 are connected to each other on a same plane, and the inclined surfaces S3 and the first surfaces S1 corresponding to the two symmetrically arranged first transistors 10 jointly define a groove 60.

When two adjacent first transistors 10 are arranged symmetrically, taking the first insulating layer J1 of the two first transistors 10 arranged symmetrically as an example, an arrangement of the first surface S1, the inclined surface S3 and the second surface S2 in the first insulating layer J1 is as follows: the two first surfaces S1 are in the middle, the inclined surface S3 of one first transistor 10 is on a side of the first surface S1 of the first transistor 10 away from the first surface S1 of the other transistor, and the second surface S2 of the one first transistor is on a side of the inclined surface S3 away from the first surface S1. The two symmetrically arranged first surfaces S1 are connected to each other on a same plane. The two inclined surfaces S3 are opposite to each other to form the groove 60 together with the two first surfaces S1. Therefore, the first insulating layers J1 in the two first transistors 10 jointly form the groove with a larger area which is easier to form. When the first doped region A1 of the first transistor 10 is electrically connected to the first electrode T1, the connection hole between the first doped region A1 and the first electrode T1 is arranged in the region corresponding to the groove with a larger area, which is easier to locate the connecting hole and simplify a forming process of the display panel.

Figure 15:
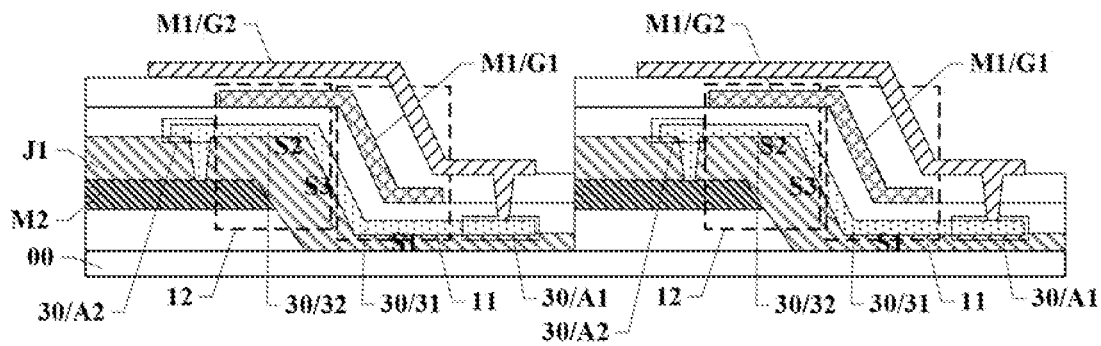
FIG. 15 illustrates another film layer diagram of two adjacent first transistors.

FIG. 15 illustrates another film layer diagram of two adjacent first transistors 10.

Referring to FIG. 15, in one optional embodiment, in two adjacent first transistors 10, along an arrangement direction of the two first transistors 10, the first sub-transistor 11 in one of the first transistors 10 is between two second sub-transistors 12.

In the embodiment, adjacent transistors are arranged repeatedly with a same structure. That is, sub-transistors in two adjacent first transistors 10 are arranged according to an arrangement of the second sub-transistor 12—the first sub-transistor 11—the second sub-transistor 12—the first sub-transistor 11. The first transistors 10 with a same structure are arranged repeatedly, which is conducive to simplifying an overall forming process of the display panel.

In one optional embodiment, both the first active layer 31 and the second active layer 32 include oxide. Therefore, both the first sub-transistor 11 and the second sub-transistor 12 in the first transistor 10 are embodied as oxide transistors. The oxide includes, for example, indium gallium zinc oxide (IGZO) or indium gallium zinc tin oxide (IGZTO). An oxide transistor has a large band gap, and electrons are not easy to transition, so a leakage current is small. Therefore, when the first transistor 10 is an oxide transistor, a signal provided to the first electrode T1 via the first transistor 10 is more accurate and stable, which is more conducive to improving a display quality of the display panel.

Referring to FIG. 3, in one optional embodiment, along the first direction D1, orthographic projections of the first active layer 31 and the second active layer 32 on the substrate are in-line, which means that an orthographic projection of the active layer 30 formed by the first active layer 31 and the second active layer 32 on the substrate is in-line. When the first active layer 31 in the first transistor 10 is arranged in an inline shape, the inline active layer 30 has a simpler structure and is easier to form than the active layer 30 with an alien structure.

Referring to FIG. 7, in one optional embodiment, in a same first transistor 10, a length of the active layer 30 on the second surface S2 is L1, a length of the active layer 30 on the inclined surface S3 is L2, a length of the active layer 30 on the first surface S1 is L3, and (L1+L2+L3)>1 μm.

The embodiment respectively shows lengths of the active layer 30 arranged on the first surface S1, the second surface S2 and the inclined surface S3 of the first insulating layer J1. When the total length of the first active layer 31 in the first transistor 10 is arranged to be less than 1 μm, a channel length of the first transistor 10 may be too small, the channels are conductive, so that the first transistor 10 cannot function as a switch. In the embodiment, the length of the active layer 30 in the first transistor 10 is arranged to be greater than 1 μm, which is conducive to increasing the channel length of the first transistor 10, avoiding channel conductorization of the first transistor 10 and ensuring a switching performance of the first transistor 10.

Referring to FIG. 4 and FIG. 7, in one optional embodiment, (L1+L3)>0.5 μm, L1>0 μm and L3>0 μm. In the embodiment, a sum of the lengths of the active layers 30 arranged on the second surface S2 and the first surface S1 is further defined. When the sum of the lengths of the active layers 30 on the second surface S2 and the first surface S1 is greater than 0.5 μm, the second metal layer M2 and the active layers 30 have certain overlapping areas to form channels for controlling the second sub-transistor 12 to increase the on-state current of the second sub-transistor 12 and improve the overall response speed of the first transistor 10. When the sum of the lengths of the active layers 30 on the two surfaces is greater than 0.5 μm, and L1>0 μm, L3>0 μm, it is also conducive to ensuring that one end of the gate on the first metal layer M1 is on the flat first surface S1, and the other end is on the flat second surface S2. If an end of the gate is formed on the inclined surface S3, it is difficult to control a width of the gate by an exposure process and ensure a performance of the first transistor 10. Therefore, when one end of the gate is arranged on the first surface S1 and the other end of the gate is arranged on the second surface S2, both two ends of the gate are ensured to be on a flat surface, the width of the gate can be better controlled in a forming process to ensure an overall performance of the first transistor 10.

When (L1+L3)>0.5 μm, optionally, L2>0.5 μm, which is conducive to ensuring that an overall channel length of the first transistor 10 is greater than 1 μm and avoid a possible problem of channel conductorization of the first transistor 10.

Along the first direction D1, a distance between the first surface S1 and the second surface S2 is H, optionally, 500 nm≤H≤2700 nm. The larger a value of H, the larger the corresponding L2 is, the longer an overall channel length of the first transistor 10 is, the less likely the channel of the first transistor 10 is to be conductive, and a uniformity of the first transistors 10 on the display panel is improved, which is conducive to improving an overall brightness uniformity of the display panel.

Figure 16:
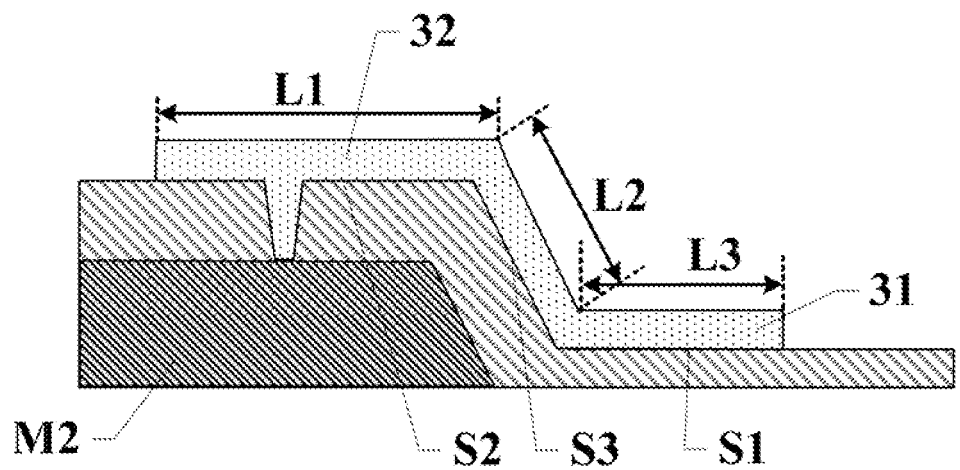
FIG. 16 illustrates another relative position relationship diagram of a first insulating layer, an active layer and a second metal layer.

FIG. 16 illustrates another relative position relationship diagram of the first insulating layer J1, the active layer 30 and the second metal layer M2.

Referring to FIG. 4 and FIG. 16, in one optional embodiment, L1>L3. When the length L1 of the active layer 30 on the second surface S2 is greater than the length L3 of the active layer 30 on the first surface S1, it is conducive to increasing the length of the active layer 30 in the second sub-transistor 12 and increasing the channel length of the second sub-transistor 12, which is equivalent to increasing a proportion of the second sub-transistor 12 in the first transistor 10. Since the second sub-transistor 12 has two channels and is controlled by the first metal layer M1 and the second metal layer M2 simultaneously, it is conducive to increasing the on-state current of the second sub-transistor 12. When the proportion of the second sub-transistor 12 in the first transistor 10 increases, the on-state current is further increased, which is conducive to further increasing the overall on-state current of the first transistor 10 and further improving the overall response speed of the display panel.

Referring to FIG. 4 and FIG. 7, in one optional embodiment, L1<L3. When the length L1 of the active layer 30 on the second surface S2 is shorter than the length L3 of the active layer 30 on the first surface S1, it is equivalent to increasing the length of the active layer 30 in the first sub-transistor 11 and increasing a proportion of the first sub-transistor 11 in the first transistor 10. Since only the first metal layer M1 overlaps the active layer 30 in the first sub-transistor 11, the channel of the first sub-transistor 11 is only controlled by the gates, so the first sub-transistor 11 can effectively control a threshold voltage of the entire first transistor 10. When the proportion of the first sub-transistor 11 in the first transistor 10 is increased, a stability of the threshold voltage of the first transistor 10 can be effectively ensured, thereby improving an overall display stability of the display panel.

Optionally, in one embodiment, in the first transistor 10, a thickness of the second metal layer M2 is D0, and 200 nm≤D0≤900 nm. The thicker a film layer of the second metal layer M2 is, the lower a resistance of traces in the second metal layer M2 is, and the smaller a voltage drop of the traces is, which is more conducive to improving a display uniformity of the display panel. Moreover, the thicker the film layer of the second metal layer M2 is, the more conducive to improving the overlapping area of the second metal layer M2 and the active layer 3, so that the on-state current of the second sub-transistor 12 can be improved better, which is conducive to increasing the overall on-state current of the first transistor 10. If the thickness of the second metal layer M2 is too large, for example greater than 900 nm, a stress of the film layer increases, which is not conducive to mass production. Optionally, D0=420 nm.

Figure 17:
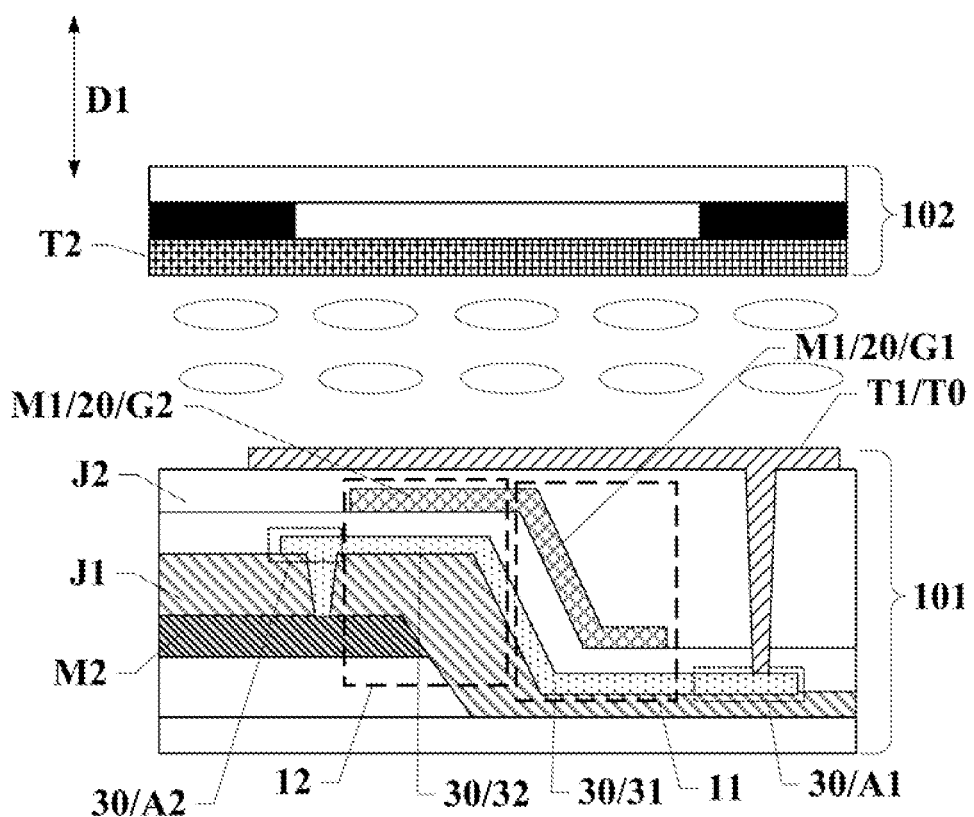
FIG. 17 illustrates a film layer diagram of a display panel consistent with various embodiments of the present disclosure.
Figure 18:
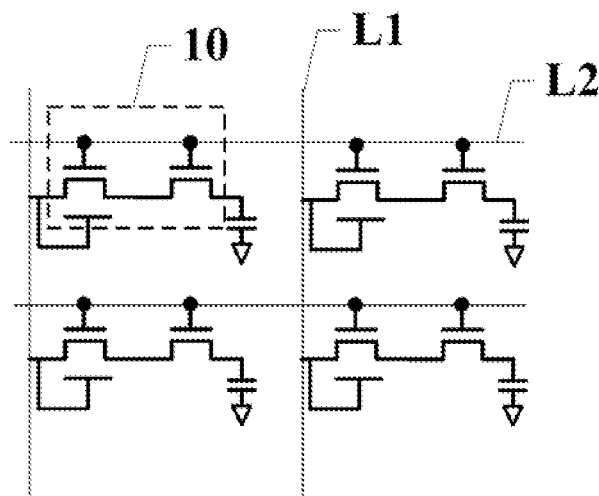
FIG. 18 illustrates a schematic diagram of a pixel driving circuit applied to a liquid crystal display panel.

FIG. 17 illustrates a film layer diagram of a display panel consistent with various embodiments of the present disclosure. One embodiment is described by taking the display panel being a liquid crystal panel as an example for illustration. FIG. 18 illustrates a schematic diagram of a pixel driving circuit applied to a liquid crystal display panel.

Referring to FIG. 17, in one optional embodiment, the display panel is a liquid crystal panel, and the display panel further includes pixel electrodes TO arranged on the side of the first metal layer M1 facing away from the substrate and a pixel driving circuit connected to the pixel electrodes. The pixel driving circuit includes the first transistors 10 described in the above embodiments, and the first transistor 10 is electrically connected to the pixel electrode TO. The pixel electrode T mentioned in the embodiment is the first electrode T1 mentioned in the present disclosure. For the pixel driving circuit in the liquid crystal panel, reference may be made to the driving circuit, such as the circuit shown in FIG. 18, which is not specifically limited herein. In some other embodiments, the pixel driving circuit may also include two or more transistors.

Specifically, when the display panel is a liquid crystal display panel, the display panel includes a first substrate 101 and a second substrate 102 arranged opposite to each other, and liquid crystal filled between the first substrate 101 and the second substrate 102. Optionally, the first transistor 10 is on the first substrate 101, and the first electrode T1 connected to the first transistor 10 is also on the first substrate 101. The display panel further includes second electrodes T2 opposite to the first electrodes T1. In the embodiment, the second electrode T2 being on the second substrate 101 is taken as an example for illustration. In some other embodiments, the second electrode T2 may also be on the first substrate 101. When different voltages are provided to the first electrode T1 and the second electrode T2 respectively, an electric field between the first electrode T1 and the second electrode T2 can drive the liquid crystal to deflect and realize a display function of the display panel. When the first transistor 10 is applied to a liquid crystal display panel, since the first transistor 10 is a transistor with a double-gate structure, and the second sub-transistor 12 has two channels, which is conducive to increasing the overall on-state current of the first transistor 10 and improve the overall response speed of the liquid crystal display panel. At a same time, since the first sub-transistor 11 has a channel and is only controlled by the gates, the first sub-transistor 11 can control an overall threshold voltage of the first transistor 10 to ensure a stability of a device.

It should be noted that when the pixel driving circuit applied to the liquid crystal display panel includes two transistors, structures of the two transistors can adopt the structure of the first transistor 10 provided by the present disclosure to improve the overall response speed of the display panel and improve a stability of the device at a same time.

Figure 19:
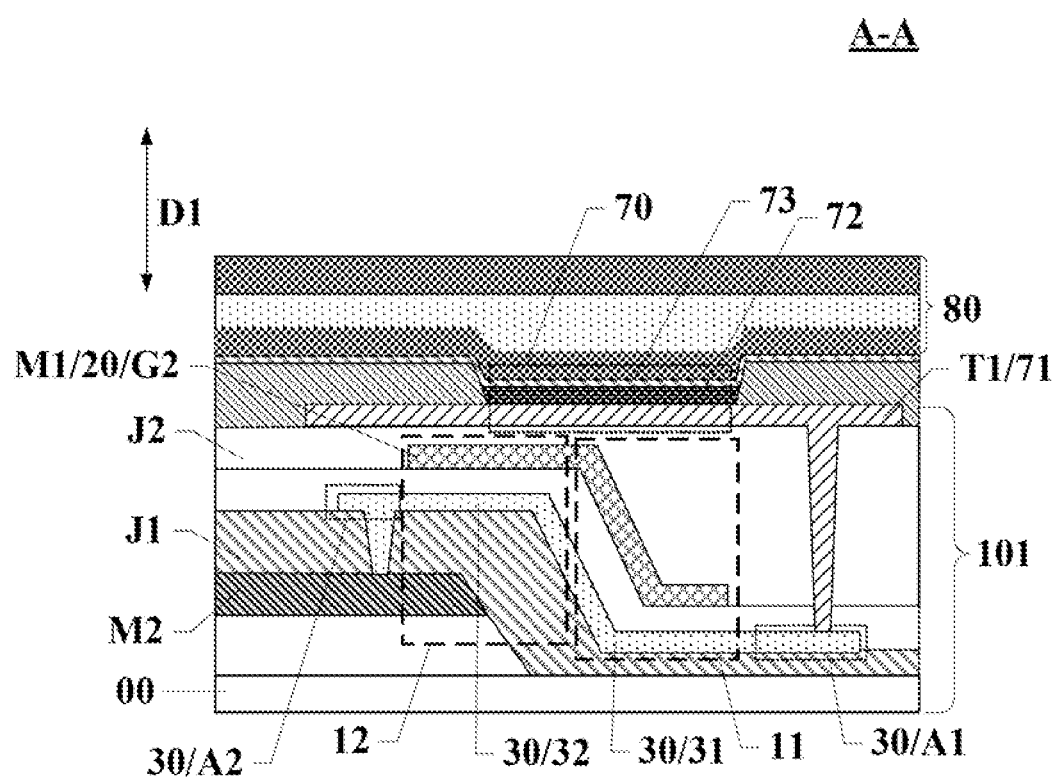
FIG. 19 illustrates another film layer diagram of a display panel consistent with various embodiments of the present disclosure.
Figure 20:
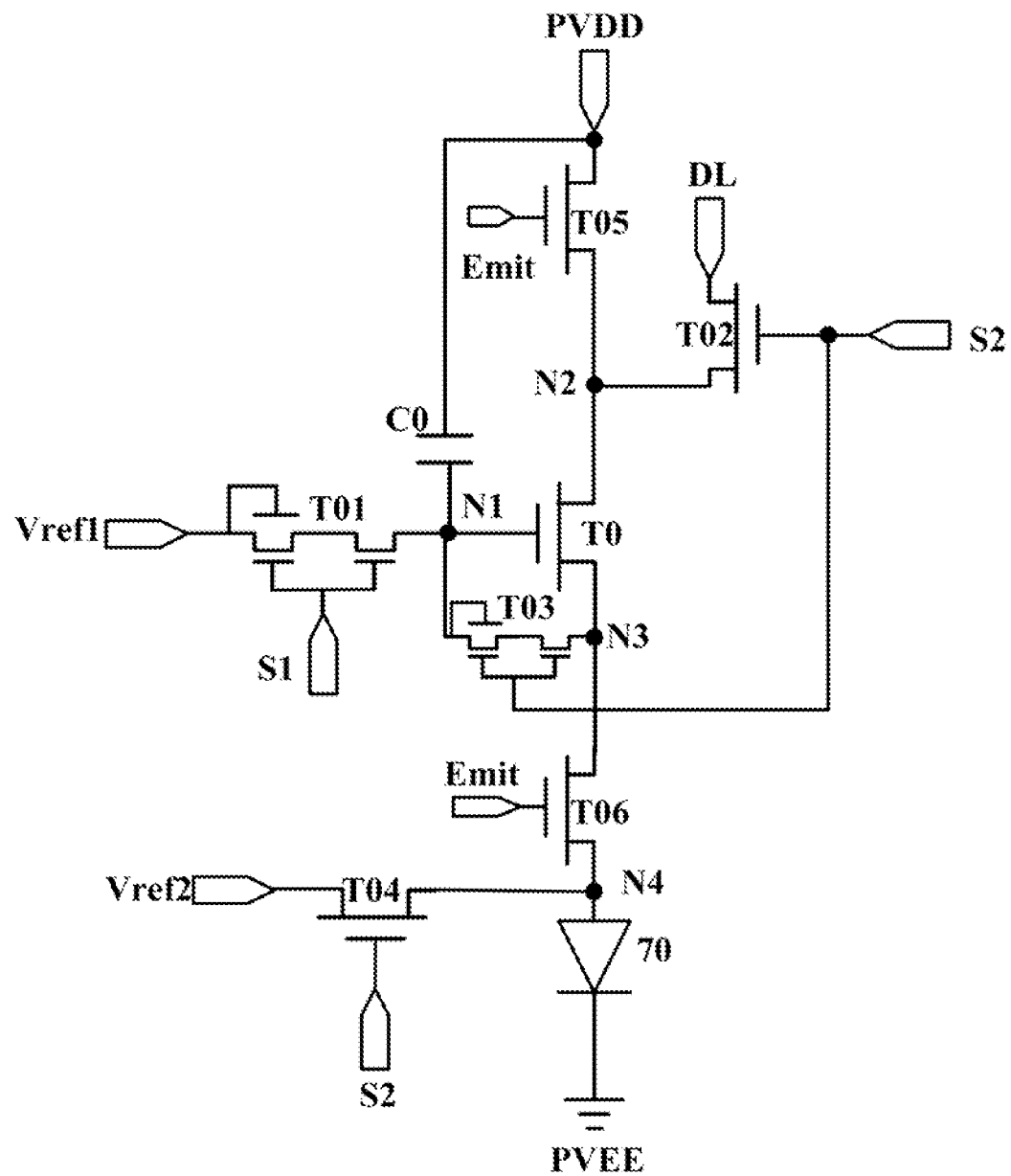
FIG. 20 illustrates a schematic diagram of a driving circuit corresponding to an organic electroluminescent display panel.

FIG. 19 illustrates another film layer diagram of a display panel consistent with various embodiments of the present disclosure. One embodiment is described by taking the display panel being an organic electroluminescent display panel as an example for illustration. FIG. 20 illustrates a schematic diagram of a driving circuit corresponding to an organic electroluminescent display panel. One embodiment only takes a pixel driving circuit with a structure of 7T1C (7 transistors and 1 capacitor) as an example for illustration but does not limit an actual structure of the pixel driving circuit. In some other embodiments, the pixel driving circuit can also be embodied in another structure, such as 8TIC, 8T2C or the like, which are not limited herein.

The pixel circuit includes a driving transistor T0, six switching transistors and a storage capacitor CO, and the six switching transistors are transistors T01-T06 respectively. Optionally, a gate of the driving transistor T0 is connected to a first node N1, a first pole is connected to a second node N2, and a second pole is connected to a third node N3, and light-emitting element 70 is connected in series between the fourth node N4 and the second power supply terminal PVEE. The transistor T01 is connected in series between the first reset terminal VreD1 and the first node N1, and the transistor T02 is connected in series between the data signal line DL and the second node N2. The transistor T03 is connected in series between the first node N1 and the third node N3. The transistor T04 is connected in series between the second reset terminal Vref2 and the fourth node N4. The transistor T05 is connected in series between the first power supply terminal PVDD and the second node N2, and the transistor T06 is connected in series between the third node N3 and the fourth node N4. The storage capacitor CO is connected in series between the first power supply terminal PVDD and the first node N1.

Optionally, referring to FIG. 8 and FIG. 11, working stages of the pixel circuit include a first reset stage, a second reset stage, a data writing stage and a light emitting stage. In the first reset stage, the transistor T01 is turned on in response to the conduction level of the first control terminal S1 and transmits the reset signal of the first reset terminal VreD1 to the first node N1. In the second reset stage, the transistor T04 is turned on in response to the conduction level of the fourth control terminal S4 and transmits the reset signal of the second reset terminal Vref2 to the fourth node N4 to reset the anode 301 of the light-emitting element 70. In the data writing stage, the transistor T02 is turned on in response to a conduction level of the second control terminal S2, and the transistor T03 is turned on in response to the conduction level of the third control terminal S2. A data signal on the data signal line DL is transmitted to the second node N2, a signal of the second node N2 is transmitted to the third node N3 through the driving transistor T0, and a signal of the third node N3 is transmitted to the first node N1. In the light-emitting stage, the transistor T05 and the transistor T06 are turned on in response to a signal of a light-emitting control signal terminal Emit, and a signal on the first power signal line PVDD is transmitted to the transistor T05 through a first power supply terminal. The first driving transistor T0 transmits a driving signal to the light-emitting element 70 to drive the light-emitting element 70 to emit light. It should be noted that the first reset stage and the second reset stage can be performed simultaneously or in a time-sharing manner and reset voltages of the first reset stage and the second reset stage can be same or different, which are not limited herein. When the reset voltages are same, the first reset terminal VreD1 and the second reset terminal Vref2 may represent a same signal terminal. The above working process of the pixel driving circuit is only for illustration and does not limit an actual working process of the pixel driving circuit in the present disclosure.

It should be noted that the above pixel driving circuit and working process are only illustrative, and do not limit the pixel driving circuit and working process actually included in the display panel.

Referring to FIG. 4, FIG. 19 and FIG. 20, in one optional embodiment, the display panel includes a light-emitting element 70 and a pixel drive circuit connected to the light-emitting element 70. The light-emitting element 70 includes an anode 71, a light emitting layer 72 and a cathode 73. Along the first direction D1, the light-emitting layer 72 is between the anode 71 and the cathode 73, and the anode 71 is on a side of the light-emitting layer 72 facing the substrate 00. The pixel driving circuit includes a driving transistor T0 and at least one switching transistor (T01-T06), and at least one switching transistor is the first transistor 10. In the embodiment, the anode 71 of the light-emitting element 70 can be regarded as the first electrode T1 described in the above embodiments.

When at least one switching transistor in the driving circuit corresponding to the organic electroluminescent display panel adopts the structure of the first transistor 10 described in any one of the above embodiments, it is conducive to improving a problem of a leakage current generated by the transistors in the pixel driving circuit, thereby improving an accuracy and a stability of a signal provided to the light-emitting element 70. Since the first transistor 10 is a transistor with a double-gate structure, and the second sub-transistor 12 has two channels, it is conducive to increasing the overall on-state current of the first transistor 10 and improving an overall response speed of the liquid crystal display panel. At a same time, since the first sub-transistor 11 has a channel and is only controlled by the gate, the first sub-transistor 11 can control an overall threshold voltage of the first transistor 10 to ensure the stability of the device.

The above embodiment only takes the transistors connected to the first node in the pixel driving circuit being the first transistors 10 as an example for illustration. When the transistors connected to the first node are the first transistors 10, it is conducive to reducing an influence of the leakage current of these transistors on the signal of the first node, improve a stability and an accuracy of a signal of the first node, and further help to improve an accuracy of a signal provided to the light-emitting element 70.

In one optional embodiment, in the above driving circuit, each switching transistor is a first transistor 10, which reduces a leakage current problem of each switching transistor in the pixel driving circuit, improves a response speed of each switching transistor and helps to further improve the overall response speed of the display panel.

Figure 21:
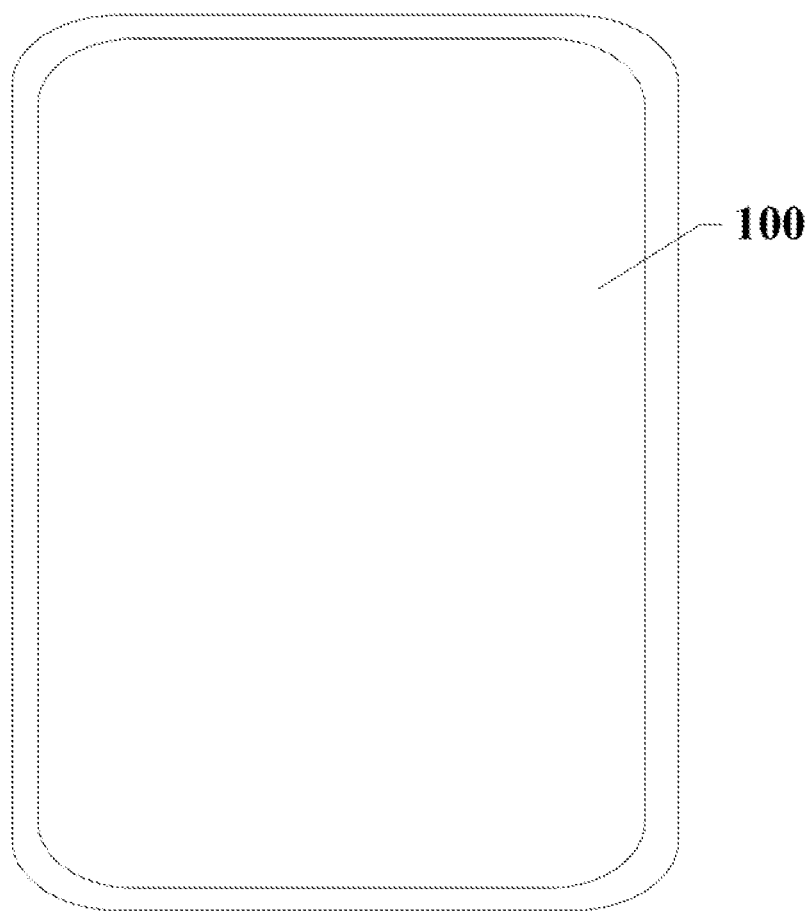
FIG. 21 illustrates a schematic diagram of a display device consistent with various embodiments of the present disclosure.

Based on a same inventive concept, the present disclosure also provides a display device. FIG. 21 illustrates a schematic diagram of a display device consistent with various embodiments of the present disclosure. The display device includes display panel 100 provided by any one of the above embodiments of the present disclosure.

It can be understood that the display device provided by the embodiment may be a mobile phone, a tablet, a computer, a TV, a vehicle display device and other display devices with display and touch functions, which are not specially limited herein. The display device provided by the embodiment has the beneficial effects of the display panel provided by any one of the above embodiments. For details, reference may be made to the specific descriptions of the display panel in the above embodiments, which is not repeated herein.

As disclosed, the display panel and the display device provided by the present disclosure at least realize the following beneficial effects.

In the display panel and the display device provided by the present disclosure, The array layer includes at least one first transistor. The first transistor includes the first sub-transistor and the second sub-transistor connected in series, and the active layers of the first sub-transistor and the second sub-transistor are on a same layer and connected to each other. The first metal layer overlaps the first active layer along the first direction to form the gate of the first sub-transistor, and the first metal layer and the second active layer overlap along the first direction to form the gate of the second sub-transistor. Along the first direction, the second metal layer overlaps the second active layer and does not overlap the first active layer. Therefore, a vertical electric field of the first transistor is mainly controlled by the gate and is also controlled by the second metal layer, which can effectively increase the on-state current of the second sub-transistor and is conducive to improving the response speed of the second sub-transistor, and the overall response speed of the display panel.

Although specific embodiments of the present disclosure have been described in detail by way of examples, a person skilled in the art should understand that the above embodiments are for illustration only, rather than limiting the scope of the present disclosure. A person skilled in the art can make modifications without departing from the scope and spirit of the present disclosure. The scope of the present disclosure is defined by the appended claims.

What is claimed is:

1. A display panel, comprising a substrate and an array layer arranged on a side of the substrate, wherein:
   the array layer includes a first metal layer, an active layer, and a second metal layer, along a first direction, the first metal layer and the second metal layer are on two sides of the active layer, and the first direction is perpendicular to the substrate;
   the array layer includes at least one first transistor including a first sub-transistor and a second sub-transistor connected in series, and the first sub-transistor includes a first active layer in the active layer, the second sub-transistor includes a second active layer in the active layer, the first active layer is connected to the second active layer; and
   along the first direction, the first metal layer overlaps both the first active layer and the second active layer, and the second metal layer overlaps the second active layer, and does not overlap the first active layer.

2. The display panel according to claim 1, wherein:
along the first direction, the second metal layer is between the active layer and the substrate;
the display panel further includes a first insulating layer arranged between the second metal layer and the active layer, the first insulating layer includes a first surface and a second surface away from the substrate, and an inclined surface connecting the first surface and the second surface, along the first direction, a distance between the first surface and the substrate is smaller than a distance between the second surface and the substrate; and
at least part of the first active layer is on the first surface, at least part of the second active layer is on the second surface, and the first active layer and the second active layer are connected at the inclined surface.

3. The display panel according to claim 2, wherein in a same first transistor, a length of the active layer on the second surface is L1, a length of the active layer on the inclined surface is L2, a length of the active layer on the first surface is L3, and (L1+L2+L3)>1 μm.

4. The display panel according to claim 3, wherein (L1+L3)>0.5 μm.

5. The display panel according to claim 3, wherein L1>L3.

6. The display panel according to claim 3, wherein L1<L3.

7. The display panel according to claim 1, wherein:
the first active layer includes a first doped region, the second active layer includes a second doped region, the first doped region is at an end of the first active layer far away from the second active layer, and the second doped region is at an end of the second active layer far away from the first active layer; and
along the first direction, the first metal layer overlaps all the first surface, the inclined surface and the second surface, and does not overlap the first doped region and the second doped region.

8. The display panel according to claim 7, further comprising first electrodes, wherein:
the first electrodes are on a side of the first metal layer facing away from the substrate, a first electrode of the first electrodes is electrically connected to the first doped region through a first connection hole, and the second doped region is electrically connected to the second metal layer.

9. The display panel according to claim 7, further comprising first electrodes, wherein:
the first electrodes are on a side of the first metal layer facing away from the substrate, a first electrode of the first electrodes is electrically connected to the second doped region through a second connection hole, and the first doped region is electrically connected to the second metal layer through a first bridging portion.

10. The display panel according to claim 9, wherein:
the first bridging portion is arranged on a same layer as the first electrode, the first bridging portion is electrically connected to the second metal layer through a third connection hole, and is electrically connected to the first doped region through a fourth connection hole; and
the second connection hole, the third connection hole and the fourth connection hole are formed in a same process.

11. The display panel according to claim 7, further comprising:
first electrodes on a side of the first metal layer away from the substrate; and a first region and a second region, a first electrode of the first electrodes in the first region being electrically connected to the first doped region through a first connection hole, and a first electrode of the first electrodes in the second region being connected to the second doped region through a second connection hole.

12. The display panel according to claim 1, further comprising first electrodes, wherein:
the first electrodes are on a side of the first metal layer away from the substrate, a second insulating layer is arranged between the first electrodes and the first metal layer, and a surface of the second insulating layer facing away from the substrate is parallel to the substrate.

13. The display panel according to claim 1, wherein at least part of the two adjacent first transistors are arranged symmetrically, a symmetry axis is between two adjacent first transistors, and is perpendicular to the substrate.

14. The display panel according to claim 13, further comprising a first insulating layer arranged between the second metal layer and the active layer, wherein:
the first insulating layer includes a first surface, a second surface, and an inclined surface connecting the first surface and the second surface; and
in the first insulating layer, the first surfaces corresponding to the two symmetrically arranged first transistors are connected on a same plane, and the inclined surfaces corresponding to the two symmetrically arranged first transistors and the first surface jointly define a groove.

15. The display panel according to claim 14, wherein in the two adjacent first transistors, along an arrangement direction of the two first transistors, the first sub-transistor in one of the first transistors is between the two second sub-transistors.

16. The display panel according to claim 1, wherein both the first active layer and the second active layer include an oxide.

17. The display panel according to claim 1, wherein the display panel is a liquid crystal panel, and the display panel further includes pixel electrodes arranged on a side of the first metal layer away from the substrate and a pixel driving circuit connected to the pixel electrodes, the pixel driving circuit includes first transistors electrically connected to the pixel electrodes.

18. The display panel according to claim 1, further comprising a light-emitting element and a pixel drive circuit connected to the light-emitting element, wherein:
the light-emitting element includes an anode, a light emitting layer and a cathode, Along the first direction, the luminescent layer is located between an anode and the cathode, and the anode is located on a side of the luminescent layer facing the substrate; and
the pixel driving circuit includes a driving transistor and at least one switching transistor, the at least one switching transistor is the first transistor.

19. The display panel according to claim 1, wherein each of the switch transistors is the first transistor.

20. A display device, comprising a display panel comprising a substrate and an array layer arranged on a side of the substrate, wherein:
the array layer includes a first metal layer, an active layer, and a second metal layer, along a first direction, the first metal layer and the second metal layer are on two sides of the active layer, and the first direction is perpendicular to the substrate;

the array layer includes at least one first transistor including a first sub-transistor and a second sub-transistor connected in series, and the first sub-transistor includes a first active layer in the active layer, the second sub-transistor includes a second active layer in the active layer, the first active layer is connected to the second active layer; and along the first direction, the first metal layer overlaps both the first active layer and the second active layer, and the second metal layer overlaps the second active layer, and does not overlap the first active layer.

* * * * *